United States Patent
Ishihara et al.

(10) Patent No.: US 10,640,853 B2
(45) Date of Patent: May 5, 2020

(54) ALUMINUM-DIAMOND-BASED COMPOSITE AND HEAT DISSIPATION COMPONENT

(71) Applicant: DENKA COMPANY LIMITED, Tokyo (JP)

(72) Inventors: Yosuke Ishihara, Omuta (JP); Takeshi Miyakawa, Omuta (JP); Hideo Tsukamoto, Omuta (JP); Kazunori Koyanagi, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 16/084,475

(22) PCT Filed: Dec. 27, 2016

(86) PCT No.: PCT/JP2016/089005
§ 371 (c)(1),
(2) Date: Sep. 12, 2018

(87) PCT Pub. No.: WO2017/158993
PCT Pub. Date: Sep. 21, 2017

(65) Prior Publication Data
US 2019/0093201 A1 Mar. 28, 2019

(30) Foreign Application Priority Data
Mar. 15, 2016 (JP) .................. 2016-051571

(51) Int. Cl.
*B22F 7/04* (2006.01)
*C22C 26/00* (2006.01)
(Continued)

(52) U.S. Cl.
CPC ............ *C22C 26/00* (2013.01); *B22F 3/17* (2013.01); *B22F 3/26* (2013.01); *C22C 21/02* (2013.01);
(Continued)

(58) Field of Classification Search
None
See application file for complete search history.

(56) References Cited

U.S. PATENT DOCUMENTS

| | | | |
|---|---|---|---|
| 10,358,704 B2 * | 7/2019 | Ishihara | C22C 26/00 |
| 2011/0198771 A1 * | 8/2011 | Hirotsuru | B22D 19/00 |
| | | | 264/45.3 |

(Continued)

FOREIGN PATENT DOCUMENTS

| | | |
|---|---|---|
| JP | 09157773 A | 6/1997 |
| JP | 2000303126 A | 10/2000 |

(Continued)

OTHER PUBLICATIONS

English language abstract for JP 09157773 A (1997).
(Continued)

*Primary Examiner* — Seth Dumbris
(74) *Attorney, Agent, or Firm* — Caesar Rivise, PC

(57) ABSTRACT

Provided is an aluminum-diamond-based composite which can be processed with high dimensional accuracy. The flat-plate-shaped aluminum-diamond-based composite is coated with a surface layer of which the entire surface has an average film thickness of 0.01-0.2 mm and which contains not less than 80 volume % of a metal containing an aluminum.

17 Claims, 2 Drawing Sheets

(51) Int. Cl.
  *C22C 21/02* (2006.01)
  *H01L 23/34* (2006.01)
  *B22F 3/17* (2006.01)
  *B22F 3/26* (2006.01)
  *H01L 23/373* (2006.01)
  *C22C 1/05* (2006.01)
  *C22C 1/04* (2006.01)
  *B22F 3/24* (2006.01)

(52) U.S. Cl.
  CPC .......... *H01L 23/34* (2013.01); *H01L 23/3732* (2013.01); *H01L 23/3736* (2013.01); *B22F 2003/247* (2013.01); *B22F 2007/045* (2013.01); *B22F 2301/052* (2013.01); *B22F 2302/406* (2013.01); *C22C 1/0416* (2013.01); *C22C 1/05* (2013.01)

(56) References Cited

U.S. PATENT DOCUMENTS

2012/0097887 A1 4/2012 Pickard et al.
2017/0268834 A1 9/2017 Ishihara et al.

FOREIGN PATENT DOCUMENTS

JP 2007518875 A 7/2007
WO 2016035789 A1 3/2016

OTHER PUBLICATIONS

English language abstract for JP 2000303126 A (2000).
English language abstract for JP 2007518875 A (2007).
English language abstract for WO 2016035789 A1 (2016).

* cited by examiner

US 10,640,853 B2

ALUMINUM-DIAMOND-BASED COMPOSITE AND HEAT DISSIPATION COMPONENT

CROSS-REFERENCE TO RELATED APPLICATIONS

This application is the U.S. National Phase Application of PCT/JP2016/089005, filed Dec. 27, 2016, which claims priority from JP 2016-051571, filed Mar. 15, 2016, the contents of which applications are incorporated herein by reference in their entireties for all purposes.

TECHNICAL FIELD

The present invention relates to an aluminum-diamond-based composite. The present invention also relates to a heat dissipation component comprising an aluminum-diamond-based composite.

BACKGROUND ART

Generally, it is important for a semiconductor element such as a semiconductor laser element and a high-frequency element used in optical communication or the like to efficiently release heat generated from the element, in order to prevent malfunction or the like. Recently, technological development of semiconductor elements has promoted high power, high speed and high integration of the elements, and a demand for heat dissipation has become increasingly more challenging. Thus, in general, a high thermal conductivity has also been required for heat dissipation components such as heat sinks, and copper (Cu) having a high thermal conductivity of 390 W/mK has been used.

On the other hand, the size of individual semiconductor element has been increased with an increase in output power, and a problem of a thermal expansion mismatch between the semiconductor element and the heat sink used for heat dissipation have become apparent. To solve the problem, there is a need for development of a heat sink material that achieves both a property of high thermal conductivity and the matching with a coefficient of thermal expansion of the semiconductor element. As such a material, a prior art proposes a composite of a metal and a ceramic, for example, a composite of aluminum (Al) and silicon carbide (SiC) (Patent Document 1).

However, the Al—SiC composite only has a thermal conductivity of 300 W/mK or less even if the conditions are optimized. Therefore, there is a need for development of a heat sink material having further higher thermal conductivity than that of copper. As such a material, a prior art proposes a metal-diamond composite having a high thermal conductivity and a coefficient of thermal expansion close to that of the semiconductor element, by a combination of the high thermal conductivity of diamond and the large coefficient of thermal expansion of a metal (Patent Document 2).

Further, patent document 3 discloses that the forming of p-type SiC layers on the surface of diamond particles suppresses generation of a metal carbide having a low coefficient of thermal expansion formed during production of a composite and improves wettability to a molten metal, thereby improving a thermal conductivity of a diamond composite material obtained.

Furthermore, diamond is a very hard material. Therefore, the metal-diamond composite obtained by compounding diamond with the metal is also very hard and is difficult to process. For this reason, the metal-diamond composite can hardly be processed with ordinary diamond tools, and has a problem of how to process it with a lower cost in order to use the metal-diamond composite for heat sinks that are small and has various shapes. To solve the problem, a method for processing the metal-ceramic composite has been studied, such as laser processing and water jet processing. Since the metal-ceramic composite can be energized, electric discharge machining has also been studied.

CITATION LIST

Patent Literature

Patent Document 1: Japanese Patent Application Publication No. H09-157773 A
Patent Document 2: Japanese Patent Application Publication No. 2000-303126 A
Patent Document 3: Japanese Patent Application Publication No. 2007-518875 A

SUMMARY OF INVENTION

Technical Problem

In a heat dissipation component for a semiconductor element, a metal layer should be added by plating or the like to a surface of the heat dissipation component in order to bond it with the element. As a mode of using the heat sink material as in the present invention, the heat sink is generally disposed in contact with the semiconductor element via a brazing material or the like, in order to efficiently dissipate heat generated by the semiconductor element. Therefore, multilayer plating or the like in which gold plating is added to the bonding surface is used. When bonded with such a brazing material or the like, a surface accuracy of the bonding interface is important for heat dissipation. However, the conventional metal-diamond composite has poor plating adhesion because the diamond particles are exposed on the entire surface, and also has coarse surface roughness of the bonding surface because the diamond particles are exposed on the bonding surface, so that thermal resistance at the contact interface is increased, which is not preferable. Therefore, there is a problem of how to reduce the surface roughness of the surface as a property required for the heat sink material.

Further, in a packaging step after bonding the semiconductor element to the heat sink material, the heat sink material is arranged in a frame, groove portion or the like, so that dimensional accuracy of the heat sink material is required. The metal-diamond composite has poor processing accuracy and difficulty in thickness processing, particularly for a small shape, because the metal-diamond composition contains diamond particles. Therefore, there is a problem of how to improve the dimensional accuracy.

When laser elements are arranged in the form of array particularly for applications of laser oscillation packages, the heat sink material is disposed between the laser elements and set in groove portions or the like. Therefore, there are needs for reduced dimensional error and flatness of the heat sink material.

Thus, one of objects of the present invention is to provide an aluminum-diamond-based composite which can be processed with high dimensional accuracy, and preferably has both a thermal conductivity and coefficient of thermal expansion suitable for use as a heat sink for a semiconductor element.

Solution to Problem

Thus, in one aspect, the present invention relates to an aluminum-diamond-based composite in a form of a flat plate, the aluminum-diamond-based composite comprising an overall surface coated with a surface layer having an average film thickness of from 0.01 to 0.2 mm, the surface layer containing 80% by volume or more of a metal containing aluminum.

In one embodiment of the aluminum-diamond-based composite according to the present invention, the aluminum-diamond-based composite has a frequency distribution of a particle size on volume basis in which a first peak is at a particle diameter of from 5 to 25 μm and a second peak is at a particle diameter of from 55 to 195 μm, and one of the first peak and the second peak is the highest peak and the other is the second highest peak; and wherein the aluminum-diamond-based composite comprises from 50% to 80% by volume of diamond powder, the diamond powder having a ratio of an area ($A_1$) of a particle size of from 1 to 35 μm to an area ($A_2$) of a particle size of from 45 to 205 μm of $A_1:A_2$=from 1:9 to 4:6.

In another embodiment of the aluminum-diamond-based composite according to the present invention, each edge and thickness of the aluminum-diamond-based composite has a dimensional error of ±0.020 mm or less.

In yet another embodiment of the aluminum-diamond-based composite according to the present invention, the aluminum-diamond-based composite comprises a surface metal layer on the surface layer, the surface metal layer being comprised of a Ni layer having a film thickness of from 0.5 μm to 6.5 μm and an Au layer having a film thickness of 0.05 μm or more, in this order from the surface layer side.

In yet another embodiment of the aluminum-diamond-based composite according to the present invention, the surface metal layer has a peel strength of 50 N/cm or more.

In yet another embodiment of the aluminum-diamond-based composite according to the present invention, the overall surface has a surface roughness (Ra) of 1 μm or less.

In yet another embodiment of the aluminum-diamond-based composite according to the present invention, the aluminum-diamond-based composite has a thermal conductivity of 400 W/mK or more at a temperature of 25° C.

In yet another embodiment of the aluminum-diamond-based composite according to the present invention, the aluminum-diamond-based composite has a linear expansion coefficient of from $5 \times 10^{-6}$ to $10 \times 10^{-6}$/K in a temperature range of from 25° C. to 150° C.

In yet another embodiment of the aluminum-diamond-based composite according to the present invention, each diamond particle forming the diamond powder comprises a layer of β-type silicon carbide chemically bonded to the surface of each diamond particle.

In another aspect, the present invention relates to a heat dissipation component for a semiconductor element, comprising the aluminum-diamond-based composite according to the present invention.

In one embodiment of the heat dissipation component for the semiconductor element according to the present invention, the semiconductor element comprises a semiconductor laser element or a high frequency element made of GaN, GaAs or SiC.

In yet another aspect, the present invention relates to a method for producing an aluminum-diamond-based composite comprising an overall surface coated with a surface layer, the method comprising:
1) preparing diamond powder;
2) preparing at least one aluminum-containing material selected from ceramics containing aluminum and metal materials containing aluminum;
3) filling a cavity of a porous mold member with the diamond powder in a state where the aluminum-containing material is placed on top and bottom surfaces of a layer of the diamond powder and the layer of the diamond powder is further sandwiched by mold release plates from top and bottom sides; and impregnating the diamond powder with the metal containing aluminum by a molten metal forging method to prepare an aluminum-diamond-based composite precursor having a flat plate shape comprising a surface layer containing 80% by volume or more of a metal containing aluminum on top and bottom surfaces of the precursor; and
4) filling a cavity of a porous mold member with the precursor in a state where the aluminum-containing material is placed on all side surfaces of the precursor and mold release plates are placed on both top and bottom surfaces of the precursor; and impregnating the precursor with the metal containing aluminum by a molten metal forging method to prepare an aluminum-diamond-based composite having a flat plate shape comprising a surface layer containing 80% by volume or more of a metal containing aluminum on all the side surfaces of the composite.

In one embodiment of the method according to the present invention, the diamond powder has a frequency distribution of a particle size on volume basis in which a first peak is at a particle diameter of from 5 to 25 μm and a second peak is at a particle diameter of from 55 to 195 μm; and wherein the diamond powder has a ratio of an area ($A_1$) of a particle size of from 1 to 35 μm to an area ($A_2$) of a particle size of from 45 to 205 μm of $A_1:A_2$=from 1:9 to 4:6.

In another embodiment of the method according to the present invention, the step 3) comprises placing the aluminum-containing material on both the top and bottom surfaces of the layer of the diamond powder such that the surface layer having a thickness of 0.02 mm or more is formed on both the top and bottom surfaces.

In yet another embodiment of the method according to the present invention, the method comprises performing, between the step 3) and the step 4), a step 3') of cutting and processing the precursor in a thickness direction such that the precursor has a size smaller than a target flat dimension of the flat plate shape by 0.02 to 0.2 mm, and wherein the step 4) comprises placing the aluminum-containing material on all the side surfaces of the precursor such that the surface layer having an average thickness of 0.02 mm or more is formed on all the side surfaces.

In yet another embodiment of the method according to the present invention, the method comprises a step of 5) grinding the surface layer of the overall surface after the step 4).

In still another embodiment of the method according to the present invention, the step 3') is carried out such that a dimensional error is more than ±0.050 mm and ±0.100 mm or less, and wherein the step 5) is carried out such that a dimensional error is ±0.020 mm or less.

Advantageous Effects of Invention

According to the present invention, it is possible to provide an aluminum-diamond-based composite having a small dimensional error. According to a preferable embodiment of the present invention, it is also possible to provide an aluminum-diamond-based composite that has a high thermal conductivity and a thermal expansion coefficient close to that of a semiconductor element, has small flatness and parallelism and can suppress generation of blister, cracks or the like in a surface metal layer portion even in actual use under a high load. The aluminum-diamond-based composite according to the present invention is preferably used as a heat sink for dissipating heat of a semiconductor element.

DESCRIPTION OF EMBODIMENTS

Description of Terminology

As used herein, the expression "(from) . . . to . . . " means "more than or equal to" and "less than or equal to". For example, the expression "(from) A to B" means more than or equal to A and more than or equal to B.

The wording "both surfaces" as used herein means both top and bottom main surfaces of a member having the form of a flat plate. The wording "side surface" as used herein means a surface which is around the above both surfaces and is substantially perpendicular to the both surfaces of the member having the form of a flat plate.

Figure 1:
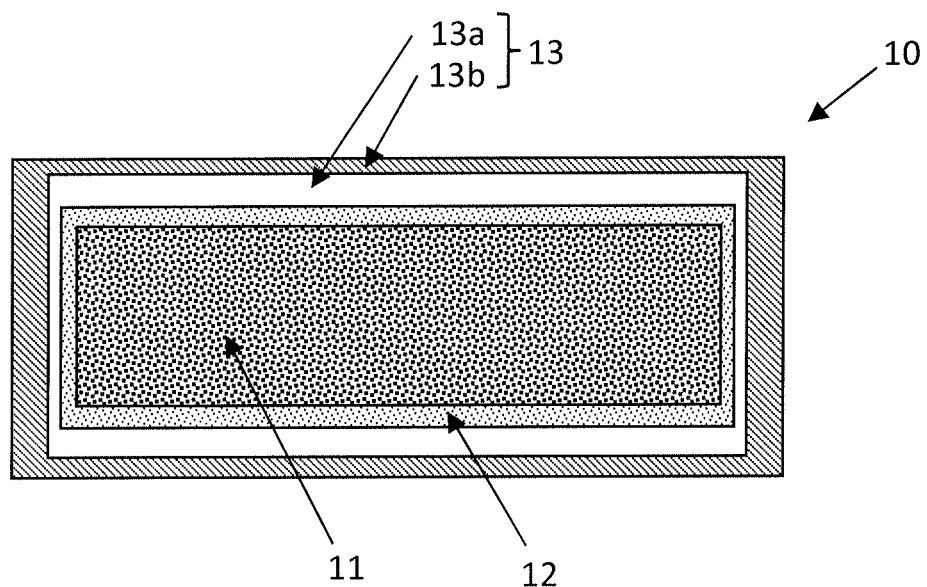
FIG. 1 is a conceptual structural view of a heat dissipation component comprised of an aluminum-diamond-based composite according to an embodiment of the present invention.

FIG. 1 shows a cross-sectional structure according to an embodiment of an aluminum-diamond-based composite 10 of the present invention. The aluminum-diamond-based composite 10 is in the form of a flat plate, and includes an aluminum-diamond-based composite portion 11; and a surface layer 12 covering an overall surface including the both surfaces and the side surfaces of the composite portion 11. The composite portion 11 is formed of a composite material composed of a matrix of aluminum or an aluminum alloy and diamond powder dispersed in the matrix, and the surface layer 12 is made of a material containing a metal containing aluminum. The content of the diamond particles is from 50% to 80% by volume of the entire aluminum-diamond-based composite 10.

On the surface layer 12, a surface metal layer 13 that acts as a brazing material for connection to the semiconductor element is provided. The surface metal layer 13 can be formed of, for example, a Ni layer 13a and an Au layer 13b.

In one embodiment of the present invention, the aluminum-diamond-based composite has a high thermal conductivity and a thermal expansion coefficient close to that of the semiconductor element, has small dimensional error, flatness and parallelism and can suppress generation of blister or the like in the surface metal layer portion even in actual use under a high load. Therefore, the aluminum-diamond-based composite according to one embodiment of the present invention is preferably used as a heat dissipation component such as heat sinks for dissipating heat of semiconductor elements.

Hereinafter, various embodiments of the aluminum-diamond-based composite according to the present invention will be described in detail, together with a method for producing the aluminum-diamond-based composite using a molten metal forging method.
(First Impregnation Step)

Here, methods for producing the aluminum-diamond-based composite are classified roughly into two types: an impregnation method and powder metallurgy. Among them, the impregnation method is often used for producing articles that are actually commercialized, in terms of characteristics such as thermal conductivity. There are also various methods in the impregnation method: a method of performing the impregnation under normal pressure and a high-pressure forging method performed under high pressure. The high-pressure forging method includes a molten metal forging method and a die casting method. A suitable method for the present invention is the high-pressure forging method in which impregnation is carried out under high pressure. In order to obtain a dense composite that is excellent in properties such as thermal conductivity, the molten metal forging method is preferable. The molten metal forging method generally refers to a method including filling a high-pressure vessel with powder or a molded body of diamond or the like and impregnating it with a molten metal such as an aluminum alloy at a high temperature and under a high pressure to obtain a composite material.
[Diamond Powder]

For diamond powder which is a raw material of the aluminum-diamond-based composite, natural diamond powder and/or artificial diamond powder can be used. To the diamond powder may optionally be added a binder such as silica. The addition of the binder can provide an effect capable of forming a molded body.

For a particle size of the diamond powder, in a frequency distribution of a particle size on volume basis, a particle diameter at a first peak is preferably from 5 to 25 μm and a particle diameter at a second peak is preferably from 55 to 195 μm, and one of the first peak and the second peak is preferably the highest peak and the other is preferably the second highest peak, and a ratio of an area ($A_1$) of a particle size of from 1 to 35 μm to an area ($A_2$) of a particle size of from 45 to 205 μm in the frequency distribution of the particle size on volume basis is preferably $A_1:A_2$=from 1:9 to 4:6, in view of thermal conductivity.

More preferably, for the particle size distribution, the particle diameter of the first peak may be from 10 μm to 20 μm and the particle diameter of the second peak may be from 100 μm to 180 μm. In order to increase an amount of the diamond powder filled, the ratio of $A_1$ to $A_2$ is preferable, and the ratio $A_1:A_2$=from 2:8 to 3:7 is more preferable. The particle size distribution is measured by a laser diffraction/scattering method. Further, the area of each particle size range is defined as the sum of frequencies (ratios of volumes) in the respective particle size ranges, provided that the horizontal axis shows the particle size and the vertical axis shows the frequency distribution on volume basis.

The content of the diamond powder in the aluminum-diamond-based composite may preferably be 50% by volume or more and 80% by volume or less. The content of the diamond powder of 50% by volume or more, and preferably 55% by volume of more, and more preferably 60% by volume or more, can sufficiently ensure the thermal conductivity of the resulting aluminum-diamond-based composite. From the viewpoint of a filling property, the content of the diamond powder may preferably be 80% by volume or less, and more preferably 75% by volume or less. The content of the diamond powder of 80% by volume or less eliminates a need for processing the diamond powder into a certain shape such as a spherical shape, and allows the aluminum-diamond-based composite to be obtained at a stable cost.

In the composite obtained by the molten metal forging method, the molten metal is interpenetrated in gaps among the powders under appropriate conditions, so that the ratio of the volume of the powder to the filling volume is equal to the volume of the powder material (the content of the particles) relative to the volume of the entire composite obtained.

Furthermore, by using diamond powder in which a layer of p-type silicon carbide is formed on the surface of the diamond powder, generation of metal carbide ($Al_4C_3$) having a low thermal conductivity formed during the forming of the composite can be suppressed, and wettability to the molten aluminum can be improved. As a result, it is possible to obtain an effect of improving the thermal conductivity of the resulting aluminum-diamond-based composite.

[Porous Mold Member]

Figure 2:
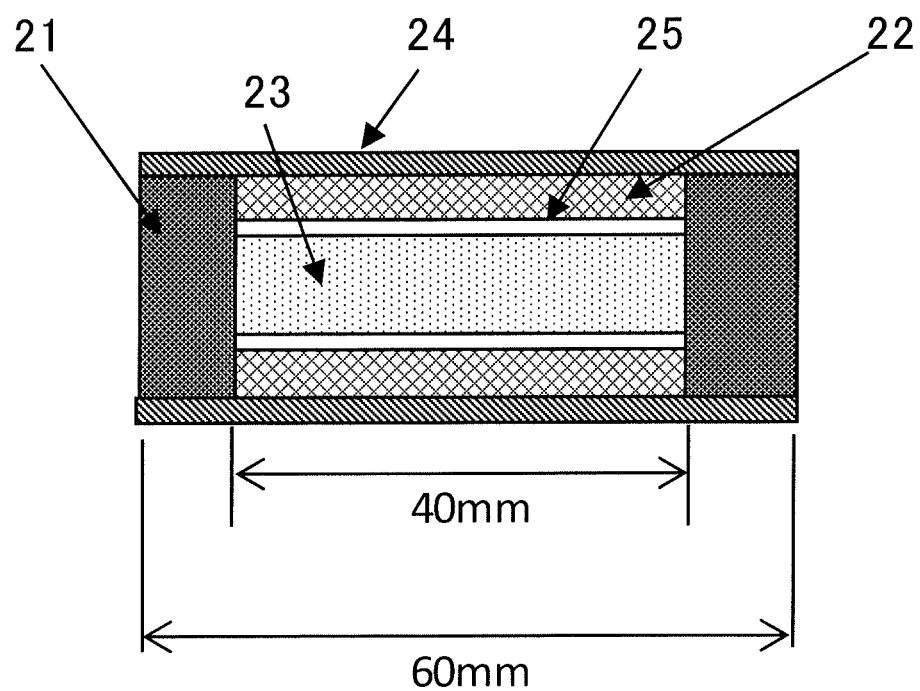
FIG. 2 is a conceptual cross-sectional view of a structure for molten metal forging in production of an aluminum-diamond-based composite according to an embodiment of the present invention.

For preparation of molten metal forging, a porous mold member 21 that can be impregnated with an aluminum alloy; dense mold release plates 22 coated with a releasing agent at least on the sides placing diamond powder 23; and the diamond powder 23 can be arranged as shown in FIG. 2 to form a structure for molten metal forging comprised of the mold material 21, the mold release plates 22 and the filled diamond powder 23.

Here, FIG. 2 is a cross-sectional view of a structure for molten metal forging, which shows a cross-sectional view of a portion filled with the diamond powder 23. When compounding the aluminum or aluminum alloy with the diamond powder 23 by the molten metal forging method, the aluminum or aluminum alloy reaches the portion filled with the diamond powder 23 through the porous mold member 21.

Here, a material of the porous mold material 21 which can be impregnated with the aluminum or aluminum alloy by the molten metal forging method is not particularly limited as long as it is a porous body which can be impregnated with the aluminum or aluminum alloy by the molten metal forging. The porous body that can be preferably used includes a porous body or the like of graphite, boron nitride, alumina fibers or the like, which has good heat resistance and allows stable supply of molten metal.

[Formation of Surface layer on Both Surfaces]

The aluminum-diamond-based composite according to one embodiment of the present invention is characterized that an overall surface of the composite portion is coated with a surface layer made of a material containing a metal containing aluminum (aluminum or an aluminum alloy). The surface layers on both top and bottom main surfaces may be formed by placing ceramics fibers such as alumina fibers between the diamond powder and the mold release plate when filling the above structure with the diamond powder, and by compounding the diamond powder with the impregnated aluminum or aluminum alloy, and may also be formed using an aluminum foil or an aluminum alloy foil in place of the ceramic fibers. The thickness of the surface layer to be formed can be adjusted by controlling the thickness of the ceramic fibers or aluminum foil to be inserted at this time. The melting point of the aluminum foil and the aluminum alloy foil should be higher than that of the impregnated aluminum or aluminum alloy. If the melting points of the aluminum foil and the aluminum alloy foil are the same as or lower than the melting point of the impregnated aluminum or aluminum alloy, the foil will melt so that it will be difficult to control the thickness of the surface layer.

[Mold Release Plate]

Further, the dense mold release plate 22 that can be used includes a stainless-steel plate or a ceramics plate, and is not particularly limited as long as it is a dense body that is not impregnated with the aluminum alloy by the molten metal forging method. Furthermore, a releasing agent can be applied to the mold release plates, and the releasing agent that can be preferably used includes releasing agents such as graphite, boron nitride and alumina, which have good heat resistance. Moreover, the surface of the mold release plate can be coated with alumina sol or the like, and the releasing agent can be then applied thereon to obtain a release plate that can achieve more stable mold release.

[Aluminum Alloy]

The metal containing aluminum in the aluminum-diamond-based composite according to an embodiment of the present invention preferably has a melting point as low as possible in order to sufficiently permeate into gaps (among diamond particles) of the diamond powder during impregnation, and thus an aluminum alloy is preferably used. For example, an aluminum alloy having a melting point of from 540 to 750° C., and preferably from 576 to 650° C., is preferably used. Examples of the aluminum alloy include an aluminum alloy containing from 5 to 25% by mass of silicon. The use of the aluminum alloy containing from 5 to 25% by mass of silicon can provide an effect of promoting the densification of the aluminum-diamond-based composite.

Further, the diamond particles and the ceramics particles can be tightly bonded to the metal moiety by containing magnesium in the aluminum alloy, which is preferable. The content of magnesium in the aluminum alloy may be, for example, 5% by mass or less, and preferably from 0.5 to 2% by mass. Metal components other than aluminum, silicon and magnesium in the aluminum alloy are not particularly limited as long as they do not drastically change the characteristics of the aluminum alloy, and copper and the like may be contained, for example. An exemplary composition of the aluminum alloy includes a composition containing from 5 to 25% by mass of silicon and from 0.5 to 2% by mass of magnesium, the balance being aluminum and unavoidable impurities.

The thickness of the aluminum-diamond-based composite according to one embodiment of the present invention can be adjusted by an amount of the diamond powder filled when forming of the composite, and the thickness of the composite is preferably from 0.4 to 6 mm. If the thickness is less than 0.4 mm, it will be difficult to obtain sufficient strength for use as a heat sink or the like. If the thickness is more than 6 mm, the material itself will be expensive and an effect of high heat conduction will not be sufficiently obtained. Further, a thickness error of the aluminum-diamond-based composite (precursor) produced through the first impregnation step may be within ±0.100 mm or less, which is suitable for obtaining the overall surface-coated composite of the present invention, by a final surface treatment.

An embodiment of the present invention is characterized by removing the mold release plates 22 arranged on both surfaces, after forming the composite. Such a unique procedure can provide an aluminum-diamond-based composite having a very smooth surface.

As shown in FIG. 2, metal plates 24 may be disposed on both surfaces of the above structure. When multiple structures are stacked to form a block, the structures may be stacked via the metal plates 24. The placing of such metal plates 24 allows uniform impregnation with the molten metal, and allows easy operation such as removal of the aluminum-diamond-based composite after the impregnation treatment.

More than one of the resulting structures may be further stacked to form a block(s), which may be heated at a temperature of from about 600 to 750° C. Then, one or more blocks may be placed in a high-pressure container, and a molten aluminum alloy heated at a temperature higher than or equal to the melting point of the alloy may be supplied as soon as possible in order to prevent a decrease in the temperature of the blocks, and a pressure of 20 MPa or more may be applied, thereby forming and molding of a composite of the diamond and the aluminum alloy.

Here, when the heating temperature of the block is 600° C. or higher, the composite of the aluminum alloy and the diamond powder will be stabilized, and an aluminum-diamond-based composite (precursor) having sufficient thermal conductivity can be obtained. Further, when the heating temperature is 750° C. or less, the formation of aluminum carbide ($Al_4C_3$) on the surface of the diamond powder can be suppressed during the forming of the composite with the aluminum alloy, and an aluminum-diamond-based composite (precursor) having sufficient thermal conductivity can be obtained.

For the pressure during the impregnation, the pressure of 20 MPa or more can lead to stable formation of the composite of the aluminum alloy and can provide an aluminum-diamond-based composite (precursor) having sufficient thermal conductivity. More preferably, the pressure during the impregnation may be 50 MPa or more. If it is 50 MPa or more, an aluminum-diamond-based composite (precursor) having more stable thermal conductivity characteristics can be obtained.

[Annealing Treatment]

The aluminum-diamond-based composite (precursor) obtained by the above operation may be subjected to an annealing treatment. By performing the annealing treatment, strains in the aluminum-diamond-based composite are removed and an aluminum-diamond-based composite having more stable thermal conductivity characteristics can be obtained.

In order to remove only the strains in the molded body without affecting the surface of the resulting aluminum-diamond-based composite (precursor), the annealing treatment is preferably carried out at a temperature of from 400° C. to 550° C. for 10 minutes or more.

[Processing Method]

Next, an example of a method for processing the aluminum-diamond-based composite (precursor) according to one embodiment of the present invention will be described. The aluminum-diamond-based composite (precursor) is very hard and difficult to process. Therefore, the aluminum-diamond-based composite is difficult to be subjected to ordinary machining or grinding using a diamond tool, and is processed by water jet machining, laser machining, or electric discharge machining. To obtain the composite according to the present invention, a dimensional error of each edge is set to preferably ±0.100 mm or less by the processing.

It should be noted that the aluminum-diamond-based composite (precursor) according to the present invention may be processed using an ordinary diamond tool or the like. However, since the aluminum-diamond-based composite (precursor) is very hard and difficult to process, water jet processing, laser processing or electric discharge machining may be preferable from the viewpoint of durability of the tool and processing cost. The processing of the shape by these processing methods can lead to a dimensional error of ±0.100 mm or less. Although the dimensional error may be ±0.050 mm or less depending on processing conditions, it requires a prolonged processing time, which is not preferable from the viewpoint of cost and productivity. Therefore, the dimensional error at this stage may be higher than ±0.050 mm.

(Second Impregnation Step)

[Formation of Surface Layer on Side Surface]

Figure 3:
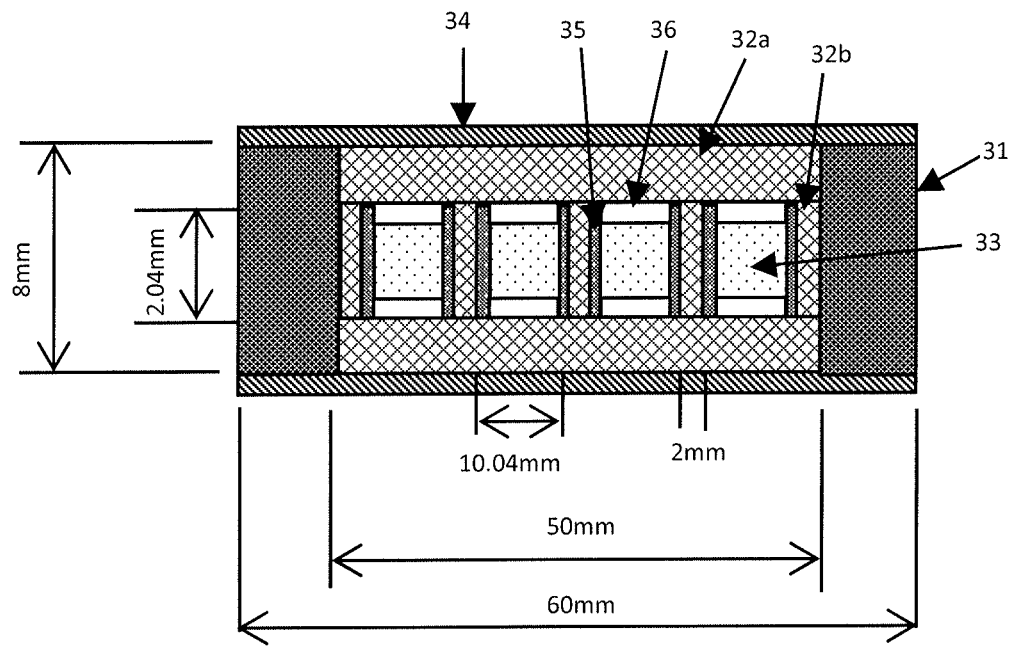
FIG. 3 is a cross-sectional view taken along the line A-A' of FIG. 4, showing a conceptual cross-section view of a structure for molten metal forging in formation of a surface layer on side surfaces of an aluminum-diamond-based composite according to an embodiment of the present invention.

The surface layer of the side surface portions of the aluminum-diamond-based composite according to one embodiment of the present invention can be formed by a molten metal forging method, a vapor deposition method, a thermal spraying method or the like. The molten metal forging method is preferably used in order to obtain the surface layer having a sufficient thickness required for the processing. After the aluminum-diamond-based composite (precursor) is processed such that the external dimension is smaller than that of the target shape by 0.02 to 0.20 mm and a dimensional error is ±0.100 mm or less, the ceramics fibers or aluminum foil or aluminum alloy foil having a thickness of 0.02 mm or more is placed on the side surfaces of the aluminum-diamond-based composite (precursor). Then the mold releasing plates coated with the releasing agent are alternately arranged to produce a structure as shown in FIG. 3, and the structure is impregnated with an aluminum alloy again by the molten metal forging method as described above in the first impregnation step.

The surface layer 12 formed on the overall surface including both main surfaces and side surfaces of the aluminum-diamond-based composite according to one embodiment of the present invention preferably contains 80% by volume or more of a metal containing aluminum. The content of the metal containing aluminum of 80% by volume or more enables the processing method used in the ordinary metal processing to be employed and the surface layer 12 to be polished. Further, the content of the metal containing aluminum is preferably 90% by volume or more. The content of the metal containing aluminum of 90% by volume or more does not cause polishing scratches due to falling of internal impurities and the like during polishing of the surface. The content of aluminum in the metal containing aluminum is preferably 75% by mass or more, and more preferably 80% by mass or more, and even more preferably 85% by mass or more, for the reason of facilitating the formation of the surface layer. It may be substantially 100% by mass when using pure aluminum. It should be noted that the term "metal containing aluminum" as used herein includes pure aluminum and aluminum alloys, but does not include any aluminum compound such as aluminum oxide. Thus, for example, alumina is not included in the "metal containing aluminum".

An average thickness of the surface layer 12 before final processing is preferably 0.02 mm or more, and more preferably 0.03 mm or more and 0.50 mm or less. When the average thickness of the surface layer before the final processing is 0.02 mm or more, the diamond particles will not be exposed in the subsequent treatment and the target surface accuracy and plating property will be easily obtained. When it is 0.03 mm or more, the surface accuracy will be further easily improved. Further, if the average thickness of the surface layer before the final processing is more than 0.5 mm, it will require prolonged processing time, resulting in a significant cost increase. The average thickness of the surface layer before the final processing is more preferably 0.3 mm or less, and still more preferably 0.1 mm or less.

[Processing of Surface Layer]

The aluminum-diamond-based composite according to one embodiment of the present invention has a structure in which the overall surface is coated with the surface layer 12 made of the material containing the metal containing aluminum. Therefore, the processing (polishing) of the surface layer 12 can provide highly controlled surface accuracy (surface roughness: Ra) and dimensional accuracy (outer shape, thickness, flatness, parallelism). The surface layer 12 can be processed by a processing method used for the ordinary metal processing, and for example, the processing of the overall surface with a surface grinding machine or the like can provide a surface roughness Ra (JIS B0601: 2001) of 1 µm or less, and preferably 0.7 µm or less, and more preferably 0.5 µm or less, for example from 0.1 to 0.4 µm; a dimensional error of each edge and thickness of ±0.020 mm or less, and preferably ±0.016 mm or less, and more preferably ±0.014 mm or less, for example ±0.012 mm or more and ±0.020 mm or less; and a flatness and parallelism of 0.010 mm or less, and preferably a flatness of 0.005 mm or less, and preferably a parallelism of 0.007 µm or less when the size is 10 mm×10 mm. The flatness and/or parallelism in such a range can lead to a uniform thickness of the bonded layer, and provide higher heat dissipation properties.

When the aluminum-diamond-based composite according to one embodiment of the present invention is used as a heat dissipation component such as a heat sink, the aluminum-diamond-based composite preferably has a smooth surface with a small surface roughness, in view of the thermal resistance of the bonding surface. The surface roughness (Ra) is preferably 1 µm or less, and more preferably 0.5 µm or less. The surface roughness of 1 µm or less can lead to a uniform thickness of the bonded layer and provide higher heat dissipation properties.

Further, the sum of the average thicknesses of the surface layer 12 for both surfaces is preferably 20% or less, and more preferably 10% or less, of the thickness of the aluminum-diamond-based composite 10. The sum of the average thicknesses of the surface layer 12 for both surfaces of 20% or less of the thickness of the aluminum-diamond-based composite 10 can provide sufficient thermal conductivity in addition to the surface accuracy and plating property. However, if the average thickness of the surface layer 12 for both surfaces is too small, the diamond will tend to be exposed, which will cause an increase of the roughness. Therefore, the average thickness of the surface layer 12 on both surfaces is preferably 0.01 mm or more, and more preferably 0.02 mm or more, and even more preferably 0.03 mm or more. Similarly, the sum of the average thicknesses of the surface layer 12 for the two opposing side surfaces is 20% or less, and more preferably 10% or less, of a distance between the opposing two side surfaces of the aluminum-diamond-based component 10.

[Surface Metal Layer]

When the aluminum-diamond-based composite according to one embodiment of the present invention is used as a heat sink for a semiconductor element, the composite is often bonded to the semiconductor element by brazing. Therefore, it is preferable to provide a surface metal layer 13 on the bonding surface of the aluminum-diamond-based composite to the semiconductor element. The surface metal layer 13 can be formed such as by laminating a Ni layer 13a and an Au layer 13. Examples of a method of forming the surface metal layer 13 that can be adopted include methods such as a plating method, an evaporation method, a sputtering method and the like. From the viewpoint of processing cost, the plating treatment is preferable. The surface metal layer 13 may be provided on the entire surface of the aluminum-diamond-based composite or may be provided on a part of the surface. A preferred example of the plating process will be described below.

First, Ni plating having a film thickness of from 0.5 to 6.5 µm is applied to the metal containing aluminum forming the surface layer 12 of the aluminum-diamond-based composite. The plating method is preferably an electroplating method that will provide a crystalline Ni plated film, but an electroless plating method may be applied. The Ni plating in this case is generally Ni alloy plating containing from 5 to 15% by weight of phosphorus (P). If the thickness of the Ni plated film is less than 0.5 µm, pinholes (non-plated portions) of the plated film may be generated. If the thickness of the Ni plated film is more than 6.5 µm, residual stress generated in the plated film will be increased, which will tend to cause a problem of blister, peeling or cracking of the plated film due to a temperature load during actual use, in applications such as the present invention. Further, there are problems that when applying the electroless plating, amorphous Ni plating is crystallized with an increase in the bonding temperature and an increase in the temperature load during actual use, and due to a change of volume at this time, microcracks are generated, and the cracks progress with the subsequent temperature load. Therefore, the Ni plated layer is preferably as thin as possible. The plated layer may optionally be a composite layer of a crystalline Ni plated film obtained by electroplating and an electroless Ni plated film.

Furthermore, when the Ni plating is applied to the metal containing aluminum, pretreatment such as zinc substitution is required, and zinc substitution leading to a good plating adhesion is preferably applied. For the adhesion of the Ni plating, the peel strength may preferably be 50 N/cm or more, and more preferably 78 N/cm or more. If the peel strength is less than 50 N/cm, peeling of the plated layer may be generated due to a temperature load during actual use, when the composite is used as a heat dissipation component for the semiconductor element.

When the composite is joined with a brazing material at an elevated temperature, Au plating having a film thickness of from 0.05 to 4 µm is preferably applied onto the outermost surface by an electroplating treatment or an electroless plating treatment. If the thickness of the plated film is less than 0.05 µm, the joining may not be sufficient. For the upper limit, there is no restriction due to characteristics. However, since the Au plating is very expensive, the thickness may preferably be 4 µm or less.

Further, the aluminum-diamond-based composite according to one embodiment of the present invention has a thermal conductivity of 400 W/mK or more when the temperature of the aluminum-diamond-based composite is 25° C., and has a linear expansion coefficient from 25° C. to 150° C. of from $5.0 \times 10^{-6}$/K to $10.0 \times 10^{-6}$/K.

The thermal conductivity at 25° C. of 400 W/mK or more and the linear expansion coefficient from 25° C. to 150° C. of $5.0 \times 10^{-6}$/K to $10.0 \times 10^{-6}$/K leads to a high thermal conductivity and a low coefficient of thermal expansion that is an equivalent level to that of the semiconductor element. Therefore, when the composite is used as a heat dissipation component such as a heat sink, the composite can suppress breakage of the semiconductor element because the composite has excellent heat dissipation characteristics and small difference in the coefficient of thermal expansion between the semiconductor element and the heat dissipation component even if they are subjected to a temperature change. As a result, the composite is preferably used as a highly reliable heat dissipation component.

[Semiconductor Element]

The heat dissipation component made of the aluminum-diamond-based composite according to one embodiment of the present invention has a high thermal conductivity and a low coefficient of thermal expansion that is an equivalent level to that of the semiconductor element, and is suitable as a heat dissipation component for semiconductor laser elements or high frequency elements requiring high output, such as GaN, GaAs and SiC. In particular, it is suitable as a heat dissipation component for a GaN-HEMT element and a GaAs-HEMT element, which are the high frequency elements.

While the aluminum-diamond-based composite according to the present invention, the heat dissipation component using the same, and the method for producing the same have been described with reference to the embodiments, the present invention is not limited to those embodiments.

EXAMPLES

Hereinafter, the present invention will be described in more detail with reference to Examples and Comparative Examples, but the present invention is not limited thereto.

Examples 1 to 13, Comparative Examples 1 to 4

Commercially available high purity diamond powder A (available from Diamond Innovation Co., Ltd.) and high purity diamond powder B (available from Diamond Innovation Co., Ltd.), each having an average particle size (which refers to a median diameter D50 on volume basis) as shown in Table 1, were mixed at a mass ratio A:B=7:3. The measurement of the particle size distribution of the mixed powder of the diamond powder A and the diamond powder B on volume basis indicated a bimodal frequency distribution of the particle size having a first highest peak and a second highest peak at positions corresponding to the average particle diameters of the respective powders. Further, a ratio of an area of a particle diameter of from 1 to 35 μm to an area of a particle diameter of from 45 to 205 μm in the frequency distribution of the particle size was 3:7. The measurement of the particle size distribution was carried out by adding each diamond powder to pure water to prepare a slurry as a measurement solution, and measuring the particle size distribution of the measurement solution using a particle size measurement apparatus (Coulter LS 230 available from Beckman Coulter, Inc.) using a laser diffraction/scattering method, with a refractive index of water of 1.33 and a refractive index of diamond of 2.42.

TABLE 1

| | Average Particle Diameter (μm) | | Error from Reference Value (mm) |
|---|---|---|---|
| | Diamond Powder A | Diamond Powder B | |
| Example 1 | 130 | 15 | +0.060 |
| Example 2 | 130 | 5 | +0.064 |
| Example 3 | 130 | 10 | +0.070 |
| Example 4 | 130 | 20 | −0.069 |
| Example 5 | 130 | 25 | +0.061 |
| Example 6 | 55 | 15 | +0.065 |
| Example 7 | 60 | 15 | −0.072 |
| Example 8 | 80 | 15 | +0.059 |
| Example 9 | 100 | 15 | +0.060 |

TABLE 1-continued

| | Average Particle Diameter (μm) | | Error from Reference Value (mm) |
|---|---|---|---|
| | Diamond Powder A | Diamond Powder B | |
| Example 10 | 90 | 15 | −0.059 |
| Example 11 | 150 | 15 | +0.065 |
| Example 12 | 180 | 15 | +0.068 |
| Example 13 | 195 | 15 | +0.055 |
| Comparative Example 1 | 50 | 10 | +0.066 |
| Comparative Example 2 | 210 | 10 | +0.065 |
| Comparative Example 3 | 130 | 2 | +0.060 |
| Comparative Example 4 | 130 | 35 | +0.065 |

A structure as shown in FIG. 2 was then produced. Specific procedure is as follows. A stainless-steel plate (SUS 430 material) having a size of 40 mm×40 mm×2 mmt was coated with an alumina sol, and baked at 350° C. for 30 minutes. A graphite based releasing agent was then applied to the surface of the plate to prepare a mold release plate 22. An isotropic graphite mold member 21 having a porosity of 20%, which had an external shape of 60 mm×60 mm×8 mmt and having a hole of 40 mm×40 mm×8 mmt at the center part, was prepared. The hole of the mold member 21 was filled with the diamond powder 23 such that pure aluminum foils 25 each having a thickness of 0.05 mm were placed on top and bottom sides of a layer composed of each diamond powder 23 as shown in Table 1 and both the top and bottom surfaces of the diamond powder 23 having a thickness of 1.94 mm were sandwiched by the mold release plates 22 to prepare a structure.

A plurality of structures as described above were stacked while sandwiching them by the stainless-steel plates 24 each having a size of 60×60×1 mmt coated with the graphite based releasing agent, and iron plates (not shown) each having a thickness of 12 mm were disposed on both top and bottom sides of the stack, and the iron plates were connected to each other by six M10 bolts and tightened by a torque wrench such that a tightening torque in the plane direction was 10 Nm, to form a single block.

The resulting block was preheated in an electric furnace at 650° C. and then placed in a press mold having an inner diameter of 300 mm which had been preheated. A molten aluminum alloy at a temperature of 800° C., which contained 12% by mass of silicon and 1% by mass of magnesium, the balance being aluminum and inevitable impurities, was poured in the mold, and pressurized at a pressure of 100 MPa for 20 minutes to impregnate the diamond powder with the aluminum alloy. After cooling to room temperature, a slightly inner side of the stainless-steel plates 24 was cut along the shape of the stainless-steel plates 24 by a wet band saw, and the stainless-steel plates 24 and the mold release plates 22 were released. To remove strains generated during impregnation, an annealing treatment was then performed at a temperature of 530° C. for 3 hours to obtain an aluminum-diamond-based composite (precursor).

Both the top and bottom surfaces of the resulting aluminum-diamond-based composite (precursor) was polished with abrasive paper of #600 and then buffed.

The aluminum-diamond-based composite (precursor) was cut and processed to a reference value of 9.940 mm×9.940 mm×2.040 mmt by a water jet processing machine (Abrasive Jet Cutter NC available from SUGINO MACHINE LIMITED) under conditions of a pressure of 250 MPa and a processing speed of 50 mm/min using garnet having a particle size of 100 μm as polishing abrasive particles, to obtain aluminum-diamond-based composites (precursors)

which were divided into 16 pieces. Dimensions of the processed aluminum-diamond-based composites (precursors) were measured using a caliper, and the results are shown in Table 1. The dimensions were measured at arbitrary one position in addition to the four edges in each of the longitudinal direction, the lateral direction and the thickness direction, and an average value thereof was obtained as a measurement value in each direction, and errors from reference value of the resulting dimensions were determined. In Examples 1 to 13 and Comparative Examples 1 to 4, the dimensional errors from the reference value in all of the directions were more than ±0.050 mm but ±0.100 mm or less.

Figure 4:
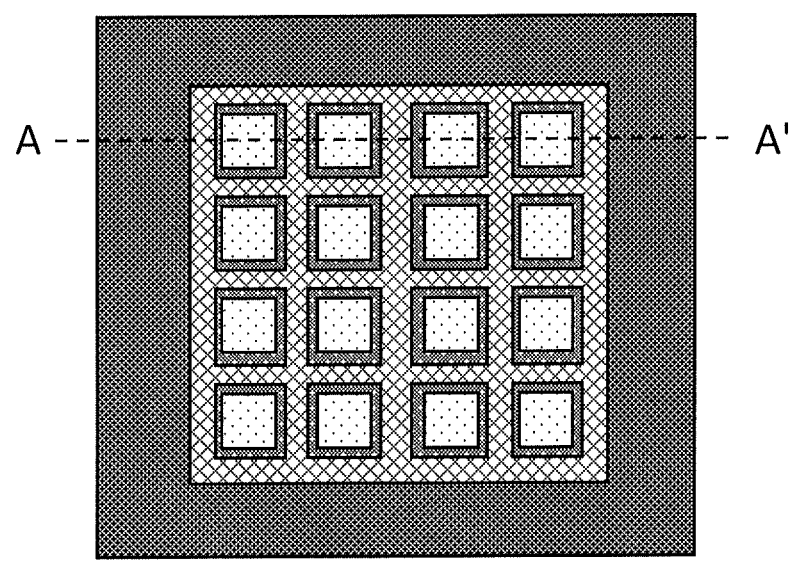
FIG. 4 is a top view of a structure for molten metal forging in formation of a surface layer on side surfaces of an aluminum-diamond-based composite according to an embodiment of the present invention.

Around the outer periphery (side surface portion) of the thus obtained 16 aluminum-diamond-based composites (precursors) 33 which had been cut and processed into a size of 9.94 mm×9.94 mm×2.040 mmt, a pure aluminum foil 35 having a thickness of 0.05 mm was wrapped once. Also, stainless-steel plates 32a, 32b for mold releasing, having sizes of 50 mm×50 mm×2 mmt and 10 mm×2 mm×2 mmt, respectively, which were subjected to the same treatment (alumina sol coating+baking treatment) as described above, were prepared. The stainless-steel plates 32a are for sandwiching the aluminum-diamond-based composites from the upper and lower sides, and the stainless-steel plates 32b are for separating the aluminum-diamond-based composites arranged in the lateral direction from each other, after the impregnation step. The use of the stainless-steel plates 32a and 32b can allow the surface layer to be uniformly formed. The aluminum-diamond-based composites (precursors) 33 around which the pure aluminums foil 35 was wrapped and the stainless-steel plates 32b were aligned in a hole of the isotropic graphite mold member with a porosity of 20%, having an external shape of 60 mm×60 mm×8 mmt. The hall was provided at the center portion of the mold member and had a size of 50×50×8 mmt as shown in FIG. 4. Both the top and bottom surfaces were then sandwiched by the stainless-steel plates 32a to obtain a structure of FIG. 3.

A plurality of structures as described above were stacked while sandwiching them by the stainless-steel plates 34 each having a size of 60×60×1 mmt, which were coated with the graphite based releasing agent, and iron plates each having a thickness of 12 mm were disposed on both sides, connected with six bolts of M10 and tightened with a torque wrench such that a tightening torque in the plane direction was 10 Nm, to form a single block.

Each of the resulting blocks was preheated in an electric furnace at 650° C. and then placed in a press mold having an inner diameter of 300 mm which had been preheated. A molten aluminum alloy at a temperature of 800° C., which contained 12% by mass of silicon and 1% by mass of magnesium, the balance being aluminum and inevitable impurities, was poured in the mold, and pressurized at a pressure of 100 MPa for 20 minutes to impregnate the diamond powder with the aluminum alloy. After cooling to room temperature, cutting was carried out along the shape of each mold release plate by a wet band saw, and the stainless steels used for sandwiching were removed. To remove strains generated during impregnation, an annealing treatment was then performed at a temperature of 530° C. for 3 hours to obtain aluminum-diamond-based composites in which a surface layer was formed on the overall surface.

Each of the resulting aluminum-diamond-based composites before grinding was broken to expose a cross section, and the cross section was observed with an industrial microscope, and thicknesses of five points including a center point and both ends of the surface layer 12 of each surface were measured at equal intervals to obtain an average thickness of the surface layer at total 30 positions of six surfaces. As a result, all of the samples of Examples 1 to 13 and Comparative Examples 1 to 4 had an average thickness of 0.05 mm.

All the six surfaces of each of the resulting aluminum-diamond-based composites were ground by 0.02 mm with a surface grinding machine (equipment name: PSG 63 DX manufactured by OKAMOTO MACHINE TOOL WORKS, LTD; grinding method: traverse grinding). The reference value was defined as 10.000 mm×10.000 mm×2.000 mmt, and dimensions of each edge and thickness of each of the resulting aluminum-diamond-based composites were measured with a caliper, and a difference from the reference value is shown in the column of "Dimensional Error" in Table 2. The dimensions were measured at arbitrary one position for each as well as the four sides in each of the longitudinal direction, the lateral direction and the thickness direction, and an average value of the dimensional errors at the total 15 positions was determined to be a measurement value. In Examples 1 to 13 and Comparative Examples 1 to 4, all the results were ±0.020 mm or less.

Using each of the resulting aluminum-diamond-based composites, the thermal conductivity at 25° C. was measured by a laser flash method (LF/TCM-8510B available from Rigaku Corporation), and each of the resulting aluminum-diamond-based composites was subjected to water jet processing to prepare a sample (3×2×10 mm) for measuring a linear expansion coefficient, and the linear expansion coefficient at a temperature from 25° C. to 150° C. was measured by a thermal expansion meter (TMA 300 available from Seiko Instruments Inc.). The results are shown in Table 2. In Comparative Examples 1 to 4, the thermal conductivity was 400 W/mK or less and the linear expansion coefficient was $10.0 \times 10^{-6}$/K or more.

The density of each of the resulting aluminum-diamond-based composites at room temperature of 25° C. was measured by the Archimedes method, and Vf (a content of diamond particles) was calculated using the law of mixture. The results are shown in Table 1 (diamond density: 3.52 g/cm$^3$, aluminum alloy density: 2.7 g/cm$^3$).

Further, each of the resulting aluminum-diamond-based composites was broken to expose a cross section, and the cross section was observed with an industrial microscope, and thicknesses of five points including the center point and both ends of the surface layer 12 for each of the six surfaces were measured at equal intervals to obtain an average thickness of the surface layer. As a result, all of the samples had an average thickness of 0.03 mm. Further, the cross section was observed by SEM, indicating that inorganic substances such as diamond particles could not be observed in the surface layer, and confirming that the surface layer was composed of substantially 100% by volume of metal containing aluminum. This is because the pure aluminum foil was used for forming the surface layer. Also, the surface roughness (Ra) (JIS B 0601: 2001) was determined with a contact type surface roughness meter (SJ 210 available from Mitutoyo Corporation), and the flatness and parallelism were measured with a contact type three-dimensional shape measuring machine (ACCURA-II available from TOKYO SEIMITSU CO., LTD.). The results are shown in Table 2.

TABLE 2

|  | Surface Layer Composition (vol. %)* | Surface Roughness/ Ra (μm) | Thermal Conductivity (W/mK) | Linear Expansion Coefficient (×10$^{-6}$/K) | Vf (vol. %) | Dimensional Error (mm) | Flatness (mm) | Parallelism (mm) |
|---|---|---|---|---|---|---|---|---|
| Example 1 | 100 | 0.32 | 585 | 7.0 | 62 | ±0.015 | 0.005 | 0.008 |
| Example 2 | 100 | 0.3 | 560 | 7.2 | 61 | ±0.015 | 0.005 | 0.007 |
| Example 3 | 100 | 0.28 | 570 | 7.1 | 62 | ±0.016 | 0.004 | 0.008 |
| Example 4 | 100 | 0.3 | 572 | 7.1 | 62.5 | ±0.015 | 0.005 | 0.007 |
| Example 5 | 100 | 0.25 | 565 | 7.2 | 61 | ±0.014 | 0.004 | 0.007 |
| Example 6 | 100 | 0.35 | 530 | 7.6 | 55 | ±0.014 | 0.004 | 0.008 |
| Example 7 | 100 | 0.33 | 545 | 7.6 | 57 | ±0.016 | 0.005 | 0.009 |
| Example 8 | 100 | 0.33 | 550 | 7.6 | 57.5 | ±0.015 | 0.003 | 0.008 |
| Example 9 | 100 | 0.32 | 560 | 7.3 | 59 | ±0.015 | 0.004 | 0.007 |
| Example 10 | 100 | 0.32 | 550 | 7.5 | 59 | ±0.015 | 0.004 | 0.008 |
| Example 11 | 100 | 0.35 | 588 | 6.9 | 63 | ±0.015 | 0.005 | 0.008 |
| Example 12 | 100 | 0.28 | 575 | 7.0 | 62.5 | ±0.015 | 0.005 | 0.008 |
| Example 13 | 100 | 0.25 | 570 | 7.2 | 61.5 | ±0.016 | 0.005 | 0.009 |
| Comparative Example 1 | 100 | 0.3 | 395 | 10.1 | 45 | ±0.015 | 0.004 | 0.009 |
| Comparative Example 2 | 100 | 0.33 | 396 | 10.2 | 46.5 | ±0.015 | 0.004 | 0.009 |
| Comparative Example 3 | 100 | 0.33 | 390 | 10.4 | 43 | ±0.013 | 0.005 | 0.007 |
| Comparative Example 4 | 100 | 0.3 | 395 | 10.3 | 44.5 | ±0.015 | 0.005 | 0.008 |

*Percentage of Metal Containing Aluminum

After each of the above ground aluminum-diamond-based composites was subjected to ultrasonic cleaning and pre-treated with a Zn catalyst, electric Ni plating and electric Au plating were sequentially performed to form a plating layer having a thickness of 4.5 μm (Ni: 2.5 μm+Au: 2.0 μm) on the surface of the aluminum-diamond-based composites according to Examples 1 to 13. A peel strength for each of the resulting plated products was determined. As a result, the peel strength was 98 N/cm or more for all the plated products. The measurement of the peel strength was carried out by masking portions other than a measuring portion having a width of 5 mm with a heat resistant tape on the surface of each aluminum-diamond-based composite on which the plating layer had been formed, soldering a copper plate having a thickness of 0.25 mm and a width of 5 mm to the measuring portion, and measuring the tensile strength by pulling the copper sheet directly upward with a digital force gauge to calculate the peel strength. Further, a heat treatment was performed at 400° C. for 10 minutes in the atmosphere, and the plated surface was then observed. As a result, no abnormality such as blister was observed for all the resulting plated products. For all the resulting plated products, no occurrence of cracks on the plated surface was observed after 1,000 heat cycles of from −65° C. to 175° C. (in air bath; maintained at each temperature for 30 minutes).

As shown in Table 2, each of the aluminum-diamond-based composites according to Examples 1 to 13 had a surface roughness of 1 μm or less, which was very smooth, and also had a higher thermal conductivity and a linear expansion coefficient close to that of a semiconductor element. It also had a difference from the reference value for each edge and thickness of ±0.020 mm or less, which was suitable as a heat sink material. It should be noted that the linear expansion coefficient of the semiconductor element is from about 5×10$^{-6}$ to 6×10$^{-6}$/K.

Examples 14 to 19, Comparative Examples 5 to 7

Aluminum-diamond-based composites were produced by the same method as that of Example 1, with the exception that in the step of forming the surface layer on the side surfaces, the pure aluminum foil having the thickness shown in Table 3 was wrapped around the outer periphery once to form a pure aluminum layer, and the overall surface was ground by a surface grinding machine such that "Processing Thickness of Each Surface" shown in Table 3 was obtained. Table 3 shows a thickness (which is nearly equal to a thickness of the surface layer) of each pure aluminum foil on both main surfaces and side surfaces after grinding, a processing thickness, and a dimensional error, flatness and parallelism determined by the same method as that of Example 1.

TABLE 3

|  | Pure Aluminum Foil Thickness (μm) | Processing Thickness of Each Surface (μm) | Dimensional Error (mm) | Flatness (mm) | Parallelism (mm) |
|---|---|---|---|---|---|
| Example 14 | 60 | 30 | ±0.009 | 0.005 | 0.005 |
| Example 15 | 50 | 10 | ±0.020 | 0.004 | 0.01 |
| Example 16 | 40 | 10 | ±0.017 | 0.005 | 0.009 |
| Example 17 | 80 | 50 | ±0.008 | 0.004 | 0.007 |
| Example 18 | 100 | 50 | ±0.009 | 0.005 | 0.007 |
| Example 19 | 150 | 100 | ±0.008 | 0.005 | 0.007 |

TABLE 3-continued

|  | Pure Aluminum Foil Thickness (μm) | Processing Thickness of Each Surface (μm) | Dimensional Error (mm) | Flatness (mm) | Parallelism (mm) |
|---|---|---|---|---|---|
| Comparative Example 5 | 50 | 5 | ±0.080 | 0.011 | 0.038 |
| Comparative Example 6 | 10 | 5 | ±0.080 | 0.015 | 0.042 |
| Comparative Example 7 | 10 | 10 | ±0.070 | 0.015 | 0.08 |

In Comparative Examples 5 and 6, the processing thickness was insufficient, and the dimensional error was 0.08 mm. In Comparative Example 7, sufficient processing could not be performed due to generation of diamond exposure. In contrast, in Examples 14 to 19, the dimensional error was ±0.02 mm or less.

Examples 20 to 23, Comparative Examples 8 and 9

Commercially available high purity diamond powder A (available from Diamond Innovation Co., Ltd./average particle size: 130 μm) and high purity diamond powder B (available from Diamond Innovation Co., Ltd./average particle size: 15 μm) were mixed at the mass ratios as shown in Table 4 The measurement of the particle size distribution of the mixed powder of the diamond powder A and the diamond powder B on volume basis indicated a bimodal frequency distribution of the particle size, which had a first peak at 15 μm and a second peak at 130 μm in the frequency distribution of the particle size, and had each ratio of an area of a particle diameter of from 1 to 35 μm to an area of a particle diameter of from 45 to 205 μm as shown in Table 4. The measurement of the particle size distribution was carried out by adding each diamond powder to pure water to prepare a slurry as a measurement solution, and measuring the particle size distribution of the measurement solution using a particle size measurement apparatus (Coulter LS 230 available from Beckman Coulter, Inc.) by a laser diffraction/scattering method, with a refractive index of water of 1.33 and a refractive index of diamond of 2.42.

TABLE 4

|  | Mass Ratio of Diamond Powder | | Area Ratio of Particle Size Distribution |
|---|---|---|---|
|  | Diamond Powder A | Diamond Powder B | from 1 to 35 μm:from 45 to 205 μm |
| Example 20 | 6 | 4 | 4:6 |
| Example 21 | 7 | 3 | 3:7 |
| Example 22 | 8 | 2 | 2:8 |
| Example 23 | 9 | 1 | 1:9 |

TABLE 4-continued

|  | Mass Ratio of Diamond Powder | | Area Ratio of Particle Size Distribution |
|---|---|---|---|
|  | Diamond Powder A | Diamond Powder B | from 1 to 35 μm:from 45 to 205 μm |
| Comparative Example 8 | 5 | 5 | 5:5 |
| Comparative Example 9 | 3 | 7 | 7:3 |

Note:
The area ratio of volume distribution indicates a ratio of an area of a volume distribution of from 1 to 35 μm to an area of a volume distribution of from 45 to 205 μm in the volume distribution.

50 g of the resulting mixed powder, 16 g of silica powder (average particle size: 5 μm) and 16 g of silicon powder (average particle diameter: 10 μm) were mixed and filled in a silicon carbide crucible, and a heating treatment was carried out in an argon atmosphere at a temperature of 1450° C. for 3 hours to prepare diamond powder in which a layer of β silicon carbide was formed on the surface of the diamond powder. X-ray diffraction indicated that β-type silicon carbide was formed.

Aluminum-diamond-based composites (precursors) were prepared by the same method as in Example 1, with the exception that the above diamond powder having the β-type silicon carbide layer formed on its surface was used as diamond powder, and pure aluminum foils each having a thickness of 0.045 mm were disposed on the top and bottom of the layer comprised of the diamond powder, in place of the pure aluminum foils each having a thickness of 0.05 mm in Example 1.

A pure aluminum layer was formed on the outer periphery of each of the resulting aluminum-diamond-based composites (precursors) in the same method as in Example 1, and the overall surface was ground with a surface grinding machine by 0.020 mm. A surface roughness (Ra), thermal conductivity, linear expansion coefficient, Vf, dimensional error, flatness and parallelism after grinding were measured by the same method as in Example 1, and the results are shown in Table 5. A dimensional error of each of the resulting aluminum-diamond-based composites was ±0.02 mm or less.

The cross section of each aluminum-diamond-based composite was exposed by fracture and observed with an industrial microscope, and an average thickness of the surface layers 12 on both surfaces was measured in the same procedure as in Example 1. As a result, the average thickness was 0.030 mm.

Further, the same characterization as that of Example 1 was carried out on the resulting aluminum-diamond-based composites. The results are shown in Table 5.

TABLE 5

|  | Surface Roughness/ Ra (μm) | Thermal Conductivity (W/mK) | Linear Expansion Coefficient ($\times 10^{-6}$/K) | Vf (vol. %) | Dimensional Error (mm) | Flatness (mm) | Parallelism (mm) |
|---|---|---|---|---|---|---|---|
| Example 20 | 0.28 | 570 | 7.2 | 61 | ±0.016 | 0.005 | 0.008 |
| Example 21 | 0.28 | 600 | 7.0 | 63 | ±0.015 | 0.005 | 0.007 |
| Example 22 | 0.28 | 590 | 7.1 | 62.5 | ±0.018 | 0.004 | 0.008 |

TABLE 5-continued

|  | Surface Roughness/ Ra (μm) | Thermal Conductivity (W/mK) | Linear Expansion Coefficient (×10$^{-6}$/K) | Vf (vol. %) | Dimensional Error (mm) | Flatness (mm) | Parallelism (mm) |
| --- | --- | --- | --- | --- | --- | --- | --- |
| Example 23 | 0.35 | 565 | 7.4 | 58 | ±0.016 | 0.005 | 0.008 |
| Comparative Example 8 | 0.3 | 397 | 10.4 | 45.5 | ±0.016 | 0.005 | 0.008 |
| Comparative Example 9 | 0.32 | 392 | 10.8 | 41.5 | ±0.017 | 0.006 | 0.007 |

In Comparative Examples 8 and 9, the thermal conductivity was 400 W/mK or less and the linear expansion coefficient was 10×10$^{-6}$/K or more.

After each of the above ground aluminum-diamond-based composites was subjected to ultrasonic cleaning and pre-treated with a Zn catalyst, electric Ni plating and electric Au plating were sequentially performed to form a plating layer having a thickness of 4.5 μm (Ni: 2.0 μm+Au: 2.5 μm) on the surface of the aluminum-diamond-based composites according to Examples 20 to 23. A peel strength of each of the resulting plated products was measured by the same method as in Example 1, indicating that the peel strength was 80 N/cm or more for all the plated products. Further, each of the resulting plated products was subjected to a heat treatment at 400° C. for 10 minutes in the atmosphere, and the plated surface was then observed. As a result, no abnormality such as blister was observed for all the resulting plated products. For all the resulting plated products, no occurrence of cracks on the plated surface was observed after 1,000 heat cycles of from −65° C. to 175° C. (in air bath; maintained at each temperature for 30 minutes).

Examples 24 to 30, Comparative Examples 10 to 12

Each aluminum-diamond-based composite (precursor) was prepared by the same method as in Example 1, with the exception that various insert materials having thicknesses as shown in Table 6 were arranged on the top and bottom of the layer composed of diamond powder, in place of the pure aluminum foils each having a thickness of 0.05 mm in Example 1. Alumina fibers (DENKA ALCEN BOARD available from Denka Company Limited/Items: BD-1600 (Example 29) and BD-1700LN (Example 30)) in Examples 29 to 30, and alumina fibers (from Denka Company Limited/DENKA ALCEN BOARD/Item: BD 1700) in Comparative Example 12, were crushed with a press machine to provide a bulk density of 1.1 g/cm³ for use as insert materials. A porosity of each alumina fiber was calculated from the density described in the mill sheet. Table 6 shows a volume ratio of a metal containing aluminum formed on both main surfaces of each of the resulting aluminum-diamond-based composites. In Examples 29, 30 and Comparative Example 12, the aluminum alloy enters the pore portions of the alumina fibers, so that the porosity itself is the ratio of the metal containing aluminum in the surface layer. For the pure aluminum foil, the proportion of the metal containing aluminum in the surface layer is substantially 100% by volume, as in Example 1 and the like.

A pure aluminum layer was formed on the outer periphery of each of the resulting aluminum-diamond-based composites (precursors) in the same method as in Example 1, and the overall surface was ground with a surface grinding machine by 0.01 mm. A dimensional error of each of the resulting aluminum-diamond-based composites was measured, indicating that it was ±0.02 mm or less for all the aluminum-diamond-based composites. In Comparative Example 12, the surface layer contained only about 70% of the metal containing aluminum, the surface roughness after the polishing treatment was higher, and polishing scratches were generated due to falling of the ceramic fibers.

The cross section of each aluminum-diamond-based composite after polishing was exposed by fracture and observed with an industrial microscope, and an average thickness of the surface layer 12 for six surfaces was measured in the same procedure as in Example 1. The results are shown in Table 6.

Further, the same characterization as that of Example 1 was carried out on the resulting aluminum-diamond-based composites. The results are shown in Table 6. In addition, for Examples 29, 30 and Comparative Example 12, the density of each of the resulting aluminum-diamond-based composites at room temperature of 25° C. was measured by the Archimedes method, and Vf (a content of diamond particles) was calculated using the law of mixture (diamond density: 3.52 g/cm³, alumina density: 3.95 g/cm³, and aluminum alloy density: 2.7 g/cm³).

TABLE 6

|  | Insert Material | Surface Layer Composition (vol. %)* | Insert Material Thickness (mm) | Average Thickness of Surface Layer (mm) | Surface Roughness/ Ra (μm) | Thermal Conductivity (W/mK) | Linear Expansion Coefficient (×10$^{-6}$/K) | Vf (vol. %) |
| --- | --- | --- | --- | --- | --- | --- | --- | --- |
| Example 24 | Pure Aluminum Foil | 100 | 0.035 | 0.040 | 0.32 | 570 | 7.0 | 62.5 |
| Example 25 | Pure Aluminum Foil | 100 | 0.050 | 0.055 | 0.3 | 570 | 7.0 | 62 |
| Example 26 | Pure Aluminum Foil | 100 | 0.100 | 0.100 | 0.32 | 562 | 7.2 | 61 |
| Example 27 | Pure Aluminum Foil | 100 | 0.150 | 0.155 | 0.28 | 562 | 7.5 | 60.5 |
| Example 28 | Pure Aluminum Foil | 100 | 0.200 | 0.200 | 0.25 | 530 | 7.9 | 55.5 |
| Example 29 | Alumina Fiber (porosity: 86%) | 86 | 0.100 | 0.100 | 0.35 | 555 | 7.5 | 61 |
| Example 30 | Alumina Fiber (porosity: 90%) | 90 | 0.150 | 0.150 | 0.38 | 560 | 7.6 | 60 |

TABLE 6-continued

|  | Insert Material | Surface Layer Composition (vol. %)* | Insert Material Thickness (mm) | Average Thickness of Surface Layer (mm) | Surface Roughness/ Ra (μm) | Thermal Conductivity (W/mK) | Linear Expansion Coefficient (×10⁻⁶/K) | Vf (vol. %) |
|---|---|---|---|---|---|---|---|---|
| Comparative Example 10 | Pure Aluminum Foil | 100 | 0.005 | 0 005 | 0.3 | 589 | 7.0 | 63 |
| Comparative Example 11 | Pure Aluminum Foil | 100 | 0.250 | 0.250 | 0.3 | 395 | 10.3 | 48 |
| Comparative Example 12 | Alumina Fiber (porosity: 70%) | 70 | 0.100 | 0.100 | 1.3 | 545 | 7.5 | 61 |

*Percentage of Metal Containing Aluminum

In Comparative Example 11, the surface layer was too thick, so that the content of diamond particles was 50% by volume or less, the thermal conductivity was 400 W/mK or less, and the linear expansion coefficient was $10.0 \times 10^{-6}$/K or more.

After each of the above aluminum-diamond-based composites was subjected to ultrasonic cleaning and pretreated with a Zn catalyst, electric Ni plating and electric Au plating were sequentially performed to form a plating layer having a thickness of 4.0 μm (Ni: 2.0 μm+Au: 2.0 μm) on the surface of the aluminum-diamond-based composites according to Examples 24 to 30 and Comparative Example 10. In Comparative Example 10, non-deposited plating was observed, and the subsequent evaluation was not carried out. A peel strength of each of the resulting plated products was measured by the same method as in Example 1, indicating that the peel strength was 80 N/cm or more for all the plated products. Further, each of the resulting plated products was subjected to a heat treatment at 400° C. for 10 minutes in the atmosphere, and the plated surface was then observed. As a result, no abnormality such as blister was observed for all the resulting plated products. For all the resulting plated products, no occurrence of cracks on the plated surface was observed after 1,000 heat cycles of from −65° C. to 175° C. (in air bath; maintained at each temperature for 30 minutes).

Comparative Example 13

An aluminum-diamond-based composite (precursor) in which surface layers were formed on both top and bottom surfaces was prepared in the same method as in Example 1, and then subjected to water jet processing into a size of 10.00 mm×10.00 mm×2.00 mmt without forming any aluminum layer on the outer periphery, to produce an aluminum-diamond-based composite (no grinding on the overall surface). A "dimensional error" determined by the same method as in Example 1 was ±0.07 mm, which was not suitable as a heat sink material requiring a severe dimensional error as in laser oscillation package applications.

DESCRIPTION OF REFERENCE NUMERALS 10 aluminum-diamond-based composite
11 composite portion
12 surface layer
13 surface metal layer
21 porous mold member
22 mold release plate
23 diamond powder
24 metal plate
25 insertion material for forming surface layer
31 porous mold member
32 mold release plate
33 aluminum-diamond-based composite (precursor)
34 metal plate
35 aluminum foil wrapped around side surface
36 surface layer formed during precursor preparation

What is claimed is:

1. An aluminum-diamond-based composite in a form of a flat plate, the aluminum-diamond-based composite comprising an overall surface coated with a surface layer having an average film thickness of from 0.01 to 0.2 mm, the surface layer containing 80% by volume or more of a metal containing aluminum.

2. The aluminum-diamond-based composite according to claim 1, wherein the aluminum-diamond-based composite has a frequency distribution of a particle size on volume basis in which a first peak is at a particle diameter of from 5 to 25 μm and a second peak is at a particle diameter of from 55 to 195 and one of the first peak and the second peak is the highest peak and the other is the second highest peak; and wherein the aluminum-diamond-based composite comprises from 50% to 80% by volume of diamond powder, the diamond powder having a ratio of an area ($A_1$) of a particle size of from 1 to 35 μm to an area ($A_2$) of a particle size of from 45 to 205 μm of $A_1:A_2$=from 1:9 to 4:6.

3. The aluminum-diamond-based composite according to claim 1, wherein each edge and thickness of the aluminum-diamond-based composite has a dimensional error of ±0.020 mm or less.

4. The aluminum-diamond-based composite according to claim 1, wherein the aluminum-diamond-based composite comprises a surface metal layer on the surface layer, the surface metal layer being comprised of a Ni layer having a film thickness of from 0.5 μm to 6.5 μm and an Au layer having a film thickness of 0.05 μm or more, in this order from the surface layer side.

5. The aluminum-diamond-based composite according to claim 4, wherein the surface metal layer has a peel strength of 50 N/cm or more.

6. The aluminum-diamond-based composite according to claim 1, wherein the overall surface has a surface roughness (Ra) of 1 μm or less.

7. The aluminum-diamond-based composite according to claim 1, wherein the aluminum-diamond-based composite has a thermal conductivity of 400 W/mK or more at a temperature of 25° C.

8. The aluminum-diamond-based composite according to claim 1, wherein the aluminum-diamond-based composite has a linear expansion coefficient of from $5 \times 10^{-6}$ to $10 \times 10^{-6}$/K in a temperature range of from 25° C. to 150° C.

9. The aluminum-diamond-based composite according to claim 1, wherein each diamond particle forming the diamond powder comprises a layer of β-type silicon carbide chemically bonded to the surface of each diamond particle.

10. A heat dissipation component for a semiconductor element, comprising the aluminum-diamond-based composite according to claim 1.

11. The heat dissipation component for the semiconductor element according to claim 10, wherein the semiconductor element comprises a semiconductor laser element or a high frequency element made of GaN, GaAs or SiC.

12. A method for producing the aluminum-diamond-based composite according to claim 1, the method comprising:
  1) preparing diamond powder;
  2) preparing at least one aluminum-containing material selected from ceramics containing aluminum and metal materials containing aluminum;
  3) filling a cavity of a porous mold member with the diamond powder in a state where the aluminum-containing material is placed on top and bottom surfaces of a layer of the diamond powder and the layer of the diamond powder is further sandwiched by mold release plates from top and bottom sides; and impregnating the diamond powder with the metal materials containing aluminum by a molten metal forging method to prepare an aluminum-diamond-based composite precursor having a flat plate shape comprising a surface layer containing 80% by volume or more of a metal containing aluminum on top and bottom surfaces of the precursor; and
  4) filling a cavity of a porous mold member with the precursor in a state where the aluminum-containing material is placed on all side surfaces of the precursor and mold release plates are placed on both top and bottom surfaces of the precursor; and impregnating the precursor with the metal containing aluminum by a molten metal forging method to prepare an aluminum-diamond-based composite having a flat plate shape comprising a surface layer containing 80% by volume or more of a metal containing aluminum on all the side surfaces of the composite.

13. The method according to claim 12, wherein the diamond powder has a frequency distribution of a particle size on volume basis in which a first peak is at a particle diameter of from 5 to 25 μm and a second peak is at a particle diameter of from 55 to 195 μm; and wherein the diamond powder has a ratio of an area ($A_1$) of a particle size of from 1 to 35 μm to an area ($A_2$) of a particle size of from 45 to 205 μm of $A_1:A_2$=from 1:9 to 4:6.

14. The method according to claim 12, wherein the step 3) comprises placing the aluminum-containing material on both the top and bottom surfaces of the layer of the diamond powder such that the surface layer having a thickness of 0.02 mm or more is formed on both the top and bottom surfaces.

15. The method according to claim 12, wherein the method comprises performing, between the step 3) and the step 4), a step 3') of cutting and processing the precursor in a thickness direction such that the precursor has a size smaller than a target flat dimension of the flat plate shape by 0.02 to 0.2 mm, and wherein the step 4) comprises placing the aluminum-containing material on all the side surfaces of the precursor such that the surface layer having an average thickness of 0.02 mm or more is formed on all the side surfaces.

16. The method according to claim 12, wherein the method comprises a step 5 of grinding the surface layer of the overall surface after the step 4).

17. The method according to claim 15, wherein the step 3) comprises placing the aluminum-containing material on both the top and bottom surfaces of the layer of the diamond powder such that the surface layer having a thickness of 0.02 mm or more is formed on both the top and bottom surfaces, and the step 3') is carried out such that a dimensional error is more than ±0.050 mm and ±0.100 mm or less, and wherein the step 5) is carried out such that a dimensional error is ±0.020 mm or less.

* * * * *

UNITED STATES PATENT AND TRADEMARK OFFICE
CERTIFICATE OF CORRECTION

PATENT NO. : 10,640,853 B2
APPLICATION NO. : 16/084475
DATED : May 5, 2020
INVENTOR(S) : Yosuke Ishihara et al.

Page 1 of 1

It is certified that error appears in the above-identified patent and that said Letters Patent is hereby corrected as shown below:

In Claim 2 at Column 24, Line 34, the wording "55 to 195 and one of" should read -- 55 to 195 μm, and one of --.

In Claim 8 at Column 24, Lines 64-65, the wording "$10 \times 10^-{}_6/K$" should read -- $10 \times 10^{-6}/K$ --.

In Claim 9 at Column 25, Line 1, the wording "(3-type silicon" should read -- β-type silicon --.

Signed and Sealed this
Twenty-eighth Day of July, 2020

Andrei Iancu
*Director of the United States Patent and Trademark Office*